(12) United States Patent
Satoh et al.

(10) Patent No.: US 10,946,453 B2
(45) Date of Patent: *Mar. 16, 2021

(54) COATED CUTTING TOOL

(71) Applicant: TUNGALOY CORPORATION, Fukushima (JP)

(72) Inventors: Hiroyuki Satoh, Iwaki (JP); Yusuke Hirano, Iwaki (JP)

(73) Assignee: TUNGALOY CORPORATION, Fukushima (JP)

(*) Notice: Subject to any disclaimer, the term of this patent is extended or adjusted under 35 U.S.C. 154(b) by 44 days.

This patent is subject to a terminal disclaimer.

(21) Appl. No.: 16/344,032

(22) PCT Filed: Oct. 6, 2017

(86) PCT No.: PCT/JP2017/036421
§ 371 (c)(1),
(2) Date: Apr. 23, 2019

(87) PCT Pub. No.: WO2018/079229
PCT Pub. Date: May 3, 2018

(65) Prior Publication Data
US 2020/0038964 A1    Feb. 6, 2020

(30) Foreign Application Priority Data
Oct. 25, 2016 (JP) .............................. JP2016-208559

(51) Int. Cl.
| B23B 27/14 | (2006.01) |
| B23B 51/00 | (2006.01) |
| B23C 5/20 | (2006.01) |
| C23C 16/40 | (2006.01) |
| C23C 28/00 | (2006.01) |

(52) U.S. Cl.
CPC ............ *B23B 27/148* (2013.01); *B23B 51/00* (2013.01); *B23C 5/20* (2013.01); *C23C 16/403* (2013.01); *C23C 28/345* (2013.01); *B23B 2222/16* (2013.01); *B23B 2222/28* (2013.01); *B23B 2226/125* (2013.01); *B23B 2226/18* (2013.01); *B23B 2228/08* (2013.01); *B23B 2228/105* (2013.01)

(58) Field of Classification Search
CPC .............. B23B 27/148; B23B 2222/16; B23B 2222/28; B23B 2226/125; B23B 2226/18; B23B 2228/105; C23C 16/403; C23C 28/345

USPC .......... 51/307, 309; 428/216, 336, 472, 698, 428/701, 702
See application file for complete search history.

(56) References Cited

U.S. PATENT DOCUMENTS

| 2005/0129987 A1* | 6/2005 | Ruppi .................. C23C 28/044 428/336 |
| 2014/0173996 A1* | 6/2014 | Stiens .................. C23C 30/005 51/309 |
| 2014/0193624 A1 | 7/2014 | Stiens et al. |
| 2015/0003925 A1* | 1/2015 | Ostlund ............. C23C 16/0272 407/119 |
| 2016/0175940 A1* | 6/2016 | Lindahl ................ C23C 28/044 428/141 |
| 2016/0263659 A1* | 9/2016 | Takahashi ............ B23B 27/148 |
| 2017/0008092 A1* | 1/2017 | Ruppi .................... C30B 29/20 |
| 2017/0342554 A1* | 11/2017 | Bjormander ......... C23C 28/048 |
| 2018/0112308 A1* | 4/2018 | Satoh ................... B23B 27/146 |
| 2018/0127874 A1* | 5/2018 | Satoh ..................... C23C 16/36 |
| 2018/0236564 A1* | 8/2018 | Kawahara .............. C23C 16/34 |

FOREIGN PATENT DOCUMENTS

| EP | 2 756 110 A1 | 7/2014 |
| EP | 2 902 528 A1 | 8/2015 |
| EP | 3 034 652 A1 | 6/2016 |
| EP | 3 034 653 A1 | 6/2016 |
| EP | 3 263 743 A1 | 1/2018 |
| EP | 3 417 965 A1 | 12/2018 |
| JP | 2014-530112 A | 11/2014 |
| WO | 2013/037997 A1 | 3/2013 |
| WO | 2015/114049 A1 | 8/2015 |
| WO | 2017/220536 A1 | 12/2017 |

OTHER PUBLICATIONS

International Search Report issued in PCT/JP2017/036421; dated Dec. 19, 2017.
International Preliminary Report on Patentability and Written Opinion issued in PCT/JP2017/036421; dated Apr. 30, 2019.

* cited by examiner

Primary Examiner — Archene A Turner
(74) Attorney, Agent, or Firm — Studebaker & Brackett PC

(57) ABSTRACT

A coated cutting tool comprising a substrate and a coating layer formed on a surface of the substrate, wherein: the coating layer comprises at least one α-type aluminum oxide layer; and, in the α-type aluminum oxide layer, a texture coefficient TC (0,0,12) of a (0,0,12) plane is from 4.0 or more to 8.4 or less, and a texture coefficient TC (1,2,11) of a (1,2,11) plane is from 0.5 or more to 3.0 or less.

20 Claims, No Drawings

COATED CUTTING TOOL

TECHNICAL FIELD

The present invention relates to a coated cutting tool.

BACKGROUND ART

It is well known that a conventional coated cutting tool used for the cutting of, for example, steel or cast iron, is a coated cutting tool which is obtained by depositing, via chemical vapor deposition, a coating layer with a total thickness of from 3 μm or more to 20 μm or less on a surface of a substrate consisting of a cemented carbide. An example of the coating layer is a coating layer consisting of a single layer of one kind selected from the group consisting of a Ti carbide, a Ti nitride, a Ti carbonitride, a Ti carboxide, a Ti oxycarbonitride and aluminum oxide, or consisting of multiple layers of two or more kinds selected therefrom.

Patent Document 1 discloses a cutting insert comprising, on a surface of a substrate, hard coating layers, wherein: at least one of the hard coating layers is an α-$Al_2O_3$ layer; in the α-$Al_2O_3$ layer, a texture coefficient TC (0012) thereof is 5 or more; the residual stress of the α-$Al_2O_3$ layer is from 0 MPa or higher to 300 MPa or lower; and the residual stress of the substrate is from −2,000 MPa or higher to −400 MPa or lower.

CITATION LIST

Patent Documents

Patent Document 1: JP2014-530112 T

SUMMARY

Technical Problem

An increase in speed, feed and depth of cut has become more conspicuous in cutting in recent times. As a result, cracking generated from a tool surface due to a load applied onto an edge during machining may reach toward a substrate, or cracking generated from a substrate due to a rapid increase/decrease in edge temperature may reach into a coating layer. These points often result in tool fracturing.

Based on such background, the tool disclosed in Patent Document 1 above has excellent wear resistance but has insufficient fracture resistance under cutting conditions which place a large load on a coated cutting tool, and the life thereof is therefore required to be further improved.

The present invention has been made in order to solve this problem, and an object of the present invention is to provide a coated cutting tool which has excellent wear resistance and fracture resistance and which accordingly has a long tool life.

Solution to Problem

The present inventors have conducted studies regarding extending the tool life of a coated cutting tool from the above-described perspective and have then found that the following configurations, including optimizing the crystal orientation of an α-type aluminum oxide layer, allow the fracture resistance to be improved, and found that, as a result, the tool life of the coated cutting tool can be extended, and this has led to the completion of the present invention.

Namely, the gist of the present invention is as set forth below:

[1] A coated cutting tool comprising a substrate and a coating layer formed on a surface of the substrate, wherein:

the coating layer comprises at least one α-type aluminum oxide layer; and in the α-type aluminum oxide layer, a texture coefficient TC (0,0,12) of a (0,0,12) plane represented by formula (1) below is from 4.0 or more to 8.4 or less, and a texture coefficient TC (1,2,11) of a (1,2,11) plane represented by formula (2) below is from 0.5 or more to 3.0 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

$$TC(1, 2, 11) = \frac{I(1, 2, 11)}{I_0(1, 2, 11)} \left\{ \frac{1}{9} \sum \frac{I(h, k, l)}{I_0(h, k, l)} \right\}^{-1} \quad (2)$$

(In formulae (1) and (2), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on JCPDS Card No. 10-0173 for α-type aluminum oxide, and (h,k,l) refers to the nine crystal planes of (0,1,2), (1,0,4), (1,1,0), (1,1,3), (1,1,6), (2,1,4), (3,0,0), (0,0,12) and (1,2,11).)

[2] The coated cutting tool according to [1], wherein, in the α-type aluminum oxide layer, the texture coefficient TC (0,0,12) is from 5.0 or more to 8.2 or less.

[3] The coated cutting tool according to [1] or [2], wherein, in the α-type aluminum oxide layer, the texture coefficient TC (1,2,11) is from 1.0 or more to 2.5 or less.

[4] The coated cutting tool according to any of [1] to [3], wherein a residual stress value in a (1,1,6) plane of the α-type aluminum oxide layer is, in at least part thereof, from −300 MPa or higher to 300 MPa or lower.

[5] The coated cutting tool according to any of [1] to [4], wherein an average particle size of the α-type aluminum oxide layer is from 0.1 μm or more to 3.0 μm or less.

[6] The coated cutting tool according to any of [1] to [5], wherein an average thickness of the α-type aluminum oxide layer is from 1.0 μm or more to 15.0 μm or less.

[7] The coated cutting tool according to any of [1] to [6], wherein the coating layer comprises, between the substrate and the α-type aluminum oxide layer, a Ti compound layer containing a Ti compound of Ti and an element of at least one kind selected from the group consisting of C, N, O and B.

[8] The coated cutting tool according to [7], wherein the Ti compound layer comprises at least one TiCN layer, and a ratio $I_{311}/I_{220}$ of a peak intensity $I_{311}$ for a (3,1,1) plane in X-ray diffraction of the TiCN layer to a peak intensity $I_{220}$ for a (2,2,0) plane in X-ray diffraction of the TiCN layer is from 1.5 or more to 20.0 or less.

[9] The coated cutting tool according to [7] or [8], wherein an average thickness of the TiCN layer is from 2.0 μm or more to 20.0 μm or less.

[10] The coated cutting tool according to any of [1] to [9], wherein an average thickness of the coating layer is from 3.0 μm or more to 30.0 μm or less.

[11] The coated cutting tool according to any of [1] to [10], wherein the substrate is a cemented carbide, cermet, ceramic or a cubic boron nitride sintered body.

Advantageous Effects of Invention

The present invention can achieve improved wear resistance and fracture resistance and can accordingly provide a coated cutting tool which has a long tool life.

DESCRIPTION OF EMBODIMENTS

An embodiment for carrying out the present invention (hereinafter simply referred to as the "present embodiment") will hereinafter be described in detail. However, the present invention is not limited to the present embodiment below. Various modifications may be made to the present invention without departing from the gist of the invention.

The coated cutting tool according to the present embodiment is a coated cutting tool comprising a substrate and a coating layer formed on a surface of the substrate, wherein: the coating layer comprises at least one α-type aluminum oxide layer; and, in the α-type aluminum oxide layer, a texture coefficient TC (0,0,12) of a (0,0,12) plane represented by formula (1) below is from 4.0 or more to 8.4 or less, and a texture coefficient TC (1,2,11) of a (1,2,11) plane represented by formula (2) below is from 0.5 or more to 3.0 or less.

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

$$TC(1, 2, 11) = \frac{I(1, 2, 11)}{I_0(1, 2, 11)} \left\{ \frac{1}{9} \sum \frac{I(h, k, l)}{I_0(h, k, l)} \right\}^{-1} \quad (2)$$

Herein, in formulae (1) and (2), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on JCPDS Card No. 10-0173 for α-type aluminum oxide, and (h,k,l) refers to the nine crystal planes of (0,1,2), (1,0,4), (1,1,0), (1,1,3), (1,1,6), (2,1,4), (3,0,0), (0,0,12) and (1,2,11).

The coated cutting tool of the present embodiment comprises the above-described configurations, and this allows the wear resistance and fracture resistance of the coated cutting tool to be improved; as a result, the tool life thereof can be extended. The factors for the improvements in wear resistance and fracture resistance of the coated cutting tool of the present embodiment can be considered to be set forth as follows; however, such factors are not limited to those set forth below. That is, firstly, in the α-type aluminum oxide layer of the present embodiment, the texture coefficient TC (0,0,12) of the (0,0,12) plane represented by formula (1) above is from 4.0 or more to 8.4 or less, and this indicates a high ratio of a peak intensity I (0,0,12) for a (0,0,12) plane, thereby leading to preferential orientation of a (0,0,12) plane. This allows for the suppression of crater wear, thereby resulting in improved wear resistance. Meanwhile, in the α-type aluminum oxide layer of the present embodiment, the texture coefficient TC (1,2,11) of the (1,2,11) plane represented by formula (2) above is from 0.5 or more to 3.0 or less, and this indicates a high ratio of a peak intensity I (1,2,11) for a (1,2,11) plane, thereby leading to preferential orientation of a (1,2,11) plane. This allows for the suppression of the generation of cracking, in particular, the suppression of the generation of cracking under cutting conditions which involve a high temperature, thereby resulting in improved fracture resistance. The total of the texture coefficient TC (0,0,12) and the texture coefficient TC (1,2,11) is 4.5 or more, which is equal to or more than the total of the texture coefficients of the other crystal planes, thereby leading to preferential orientation of a (0,0,12) plane and a (1,2,11) plane over the other crystal planes, and accordingly, the above improved wear resistance and fracture resistance can be reliably achieved.

A coated cutting tool according to the present embodiment comprises a substrate and a coating layer provided on the substrate. Specific examples of types of the coated cutting tool include an indexable cutting insert for milling or turning, a drill and an end mill.

The substrate in the present embodiment is not particularly limited, as long as it may be used as a substrate for a coated cutting tool. Examples of the substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and the substrate is further preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

The average thickness of the coating layer in the present embodiment is preferably from 3.0 μm or more to 30.0 μm or less. If the average thickness of the coating layer is 3.0 μm or more, this indicates the tendency of the wear resistance to be further improved, and if the average thickness thereof is 30.0 μm or less, this indicates the tendency of the adhesion of the coating layer with the substrate and the fracture resistance to be further increased. From the same perspective, the average thickness of the coating layer is more preferably from 3.0 μm or more to 20.0 μm or less, and is further preferably from 5.0 μm or more to 20.0 μm or less. It should be noted that the average thickness of each layer in the coated cutting tool of the present embodiment can be obtained by: measuring the thickness of each layer and the thickness of the entire coating layer from each of the cross-sectional surfaces at three or more locations; and calculating the average value of the resulting measurements.

The coating layer in the present embodiment includes at least one α-type aluminum oxide layer. In the α-type aluminum oxide layer, a texture coefficient TC (0,0,12) of a (0,0,12) plane represented by formula (1) above is from 4.0 or more to 8.4 or less. If the texture coefficient TC (0,0,12) is increased, the ratio of a peak intensity I (0,0,12) for the (0,0,12) plane is high, thereby resulting in improved wear resistance as this leads to the suppression of crater wear. From the same perspective, the texture coefficient TC (0,0,12) in the α-type aluminum oxide layer is preferably from 5.0 or more to 8.2 or less, and is more preferably from 5.5 or more to 8.1 or less.

In the α-type aluminum oxide layer, a texture coefficient TC (1,2,11) of a (1,2,11) plane represented by formula (2) above is from 0.5 or more to 3.0 or less. If the texture coefficient TC (1,2,11) is increased, the ratio of a peak intensity I (1,2,11) for the (1,2,11) plane is high, as a result of which the occurrence of cracking can be suppressed, thereby leading to excellent fracture resistance. From the same perspective, the texture coefficient TC (1,2,11) in the α-type aluminum oxide layer is preferably from 1.0 or more to 2.5 or less.

The average thickness of the α-type aluminum oxide layer in the present embodiment is preferably from 1.0 μm or more to 15.0 μm or less. If the average thickness of the α-type aluminum oxide layer is 1.0 μm or more, this indicates the tendency of the crater wear resistance in the rake surface of the coated cutting tool to be further improved. Meanwhile, if the average thickness of the α-type aluminum oxide layer is 15.0 μm or less, this indicates the tendency of the fracture resistance to be further improved as peeling is further suppressed. From the same perspective, the average thickness of the α-type aluminum oxide layer is more preferably from 3.0 μm or more to 12.0 μm or less.

In the present embodiment, the residual stress value in a (1,1,6) plane of the α-type aluminum oxide layer is preferably, at least in part thereof, from −300 MPa or higher to 300 MPa or lower. If the residual stress value is −300 MPa or higher, this indicates the tendency of the wear resistance to be improved because the progress of wear—which starts from the time when particles fall off from the α-type aluminum oxide layer—can be suppressed. Further, if the residual stress value is 300 MPa or lower, this indicates the tendency of the fracture resistance of the coated cutting tool to be further improved because the occurrence of cracking in the α-type aluminum oxide layer can be further suppressed. From the same perspective, the residual stress value in the (1,1,6) plane of the α-type aluminum oxide layer is more preferably from −300 MPa or higher to 100 MPa or lower.

Herein, the term "at least in part thereof" indicates that it is not necessary to satisfy, in the entire α-type aluminum oxide layer, the above residual stress value range in the (1,1,6) plane of the α-type aluminum oxide layer, and such term also indicates that it is only required to satisfy the above residual stress value range in the (1,1,6) plane of the α-type aluminum oxide layer in a specific area such as a rake surface.

The residual stress value of the α-type aluminum oxide layer can be measured by a $\sin^2\varphi$ method using an X-ray stress measuring apparatus. For instance, the residual stresses at any three points included in the coating layer are measured via the $\sin^2\varphi$ method, and the average value of the residual stresses at such three points is then obtained. Any three points, serving as measurement locations, in the coating layer are, for example, selected in such a way as to be 0.1 mm or more apart from one another.

In order to measure the residual stress value in the (1,1,6) plane of the α-type aluminum oxide layer, the (1,1,6) plane of the α-type aluminum oxide layer which serves as a measurement subject is selected. More specifically, a sample in which an α-type aluminum oxide layer is formed is subjected to analysis with an X-ray diffractometer. Then, an examination is conducted regarding variations in the diffraction angle of the (1,1,6) plane when a change is made to an angle φ formed by a sample plane normal and a lattice plane normal.

In the coated cutting tool of the present embodiment, if the average particle size of the α-type aluminum oxide layer is 0.1 μm or more, this shows the tendency of the fracture resistance to be further improved. Meanwhile, if the average particle size of the α-type aluminum oxide layer is 3.0 μm or less, this shows the tendency of the wear resistance in the flank to be further improved. Thus, the average particle size of the α-type aluminum oxide layer is preferably from 0.1 μm or more to 3.0 μm or less. In particular, from the same perspective as that set forth above, the average particle size of the α-type aluminum oxide layer is more preferably from 0.3 μm or more to 1.5 μm or less.

In the coated cutting tool of the present embodiment, the average particle size of the α-type aluminum oxide layer can be obtained, using a commercially available electron backscatter diffraction pattern apparatus (EBSD) attached to a field emission scanning electron microscope (FE-SEM) or to a transmission electron microscope (TEM). A specific related example is shown below. Mirror polishing is performed on the coated cutting tool in a direction parallel or substantially parallel to the substrate surface, and a cross-sectional structure of an α-type aluminum oxide layer is made exposed. Examples of a method of having a cross-sectional structure of an α-type aluminum oxide layer exposed include: a polishing method with the use of diamond paste or colloidal silica; and ion milling. A sample obtained by having a cross-sectional structure of an α-type aluminum oxide layer exposed is set on an FE-SEM, and such sample is irradiated with an electron beam under the conditions of an angle of incidence of 70 degrees, an acceleration voltage of 15 kV, and an irradiation current of 0.5 nA. Measurement is performed under the EBSD settings of a measurement range of 30 μm×50 μm and a step size of 0.1 μm. A particle is defined as an area surrounded by a structure boundary with a misorientation of 5 degrees or more. The diameter of a circle whose area is equal to the area of a particle is regarded as a particle size of such particle. Image analysis software may be used when obtaining a particle size of the cross-sectional structure of the α-type aluminum oxide layer. The particle sizes in the α-type aluminum oxide layer are obtained with regard to a range of 30 μm×50 μm, and the average value is regarded as an average particle size of the α-type aluminum oxide layer.

The coating layer of the present embodiment preferably comprises, between the substrate and the α-type aluminum oxide layer, a Ti compound layer containing a Ti compound of Ti and an element of at least one kind selected from the group consisting of C, N, O and B, as this leads to further improved wear resistance and adhesion. The Ti compound layer, from the same perspective, preferably contains a Ti compound of Ti and an element of at least one kind selected from the group consisting of C, N and O.

The Ti compound layer of the present embodiment preferably comprises at least one TiCN layer because this leads to further improved wear resistance. When regarding a peak intensity for a (2,2,0) plane in X-ray diffraction of the TiCN layer as $I_{220}$ and also regarding a peak intensity for a (3,1,1) plane in X-ray diffraction of the TiCN layer as $I_{311}$, a ratio $I_{311}/I_{220}$ of $I_{311}$ to $I_{220}$ is preferably from 1.5 or more to 20.0 or less. If the ratio $I_{311}/I_{220}$ in the TiCN layer is from 1.5 or more to 20.0 or less, this indicates the tendency of the adhesion of the TiCN layer to the α-type aluminum oxide layer to be further improved. Further, it is preferable that, if the ratio $I_{311}/I_{220}$ in the TiCN layer is from 1.5 or more to 20.0 or less, this indicates the tendency of the texture coefficient TC (1,2,11) in the α-type aluminum oxide layer to have an even greater value. From the same perspective, the ratio $I_{311}/I_{220}$ in the TiCN layer is more preferably from 2.5 or more to 20.0 or less.

As to the peak intensity of each crystal plane of each of the α-type aluminum oxide layer and the TiCN layer, such peak intensity can be measured using a commercially available X-ray diffractometer. For instance, when performing an X-ray diffraction measurement, with an X-ray diffractometer "RINT TTR III" manufactured by Rigaku Corporation, by means of a 2θ/θ focusing optical system with Cu-Kα radiation under the following conditions: an output: 50 kV, 250 mA; an incident-side solar slit: 5°; a divergence longitudinal slit: ⅔°; a divergence longitudinal limit slit: 5 mm;

a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-155°. As a result, the peak intensities of the plane indices can be measured. When obtaining the peak intensity of each plane index from an X-ray diffraction pattern, analysis software included with the X-ray diffractometer may be used. With such analysis software, background processing and Kα2 peak removal are conducted using cubic spline, and profile fitting is conducted using Pearson-VII function, whereby each peak intensity can be obtained. It should be noted that, when each type of coating layer is formed so as to be closer to the substrate than the α-type aluminum oxide layer, each peak intensity can be measured by a thin-film X-ray diffraction method in order to avoid the influence of such type of coating layer. Further, when each type of coating layer is formed so as to be further outward than the α-type aluminum oxide layer, such type of coating layer may be removed via buffing, and then an X-ray diffraction measurement may be performed.

The average thickness of the TiCN layer of the present embodiment is preferably from 2.0 μm or more to 20.0 μm or less. If the average thickness of the TiCN layer is 2.0 μm or more, this indicates the tendency of the wear resistance to be further improved, and, if such average thickness is 20.0 μm or less, this indicates the tendency of the fracture resistance to be further improved as peeling is further suppressed. From the same perspective, the average thickness of the TiCN layer is more preferably from 5.0 μm or more to 15.0 μm or less.

The TiCN layer is a layer comprised of TiCN. However, such layer may contain a very small amount of components other than TiCN, as long as it has the above-described configuration and provides the operation and effects of the TiCN layer.

The Ti compound layer of the present embodiment preferably comprises a lowermost layer, being comprised of TiN, between the substrate and the TiCN layer as this leads to improved adhesion. The average thickness of the lowermost layer is preferably from 0.1 μm or more to 0.5 μm or less. If the average thickness of the lowermost layer is 0.1 μm or more, the lowermost layer has a more uniform structure, thereby leading to the tendency of the adhesion to be further improved. Meanwhile, if the average thickness of the lowermost layer is 0.5 μm or less, this further prevents the lowermost layer from serving as a starting point for peeling, thereby leading to the tendency of the fracture resistance to be further increased.

The coating layer of the present embodiment preferably comprises an outermost layer, being comprised of TiN, on the opposite side to the substrate as this makes it possible to confirm the usage state of the coated cutting tool, thereby leading to excellent visibility. The average thickness of the outermost layer is preferably from 0.2 μm or more to 1.0 μm or less. This is preferable in that: if the average thickness of the outermost layer is 0.2 μm or more, this provides the effect of further suppressing the falling of particles from the α-type aluminum oxide layer; and, if such average thickness is 1.0 μm or less, this leads to further improved fracture resistance.

The outermost layer and the lowermost layer are each a layer comprised of TiN. However, each of such layers may contain a very small amount of components other than TiN, as long as it has the above-described relevant configuration and provides the operation and effects of either the outermost layer or the lowermost layer.

The Ti compound layer of the present embodiment preferably comprises, between the TiCN layer and the α-type aluminum oxide layer, an intermediate layer, being comprised of TiCNO or TiCO, as this leads to further improved adhesion. The average thickness of such intermediate layer is preferably from 0.2 μm or more to 1.5 μm or less. This is preferable in that: if such average thickness is 0.2 μm or more, this indicates the tendency of the adhesion to be further improved; and, if such average thickness is 1.5 μm or less, this indicates the tendency of the texture coefficient TC (0,0,12) in the α-type aluminum oxide layer to have a greater value.

The intermediate layer is a layer comprised of TiCNO or TiCO. However, such intermediate layer may contain a very small amount of components other than the above compounds, as long as it has the above configuration and provides the operation and effects of the intermediate layer.

Examples of a method of forming layers that constitute a coating layer in a coated cutting tool according to the present embodiment include the method set forth below. However, such method of forming layers is not limited thereto.

For instance, a TiN layer can be formed by chemical vapor deposition with a raw material gas composition of $TiCl_4$: from 5.0 mol % or more to 10.0 mol % or less, $N_2$: from 20 mol % or more to 60 mol % or less, and $H_2$: the balance, a temperature of from 850° C. or higher to 920° C. or lower, and a pressure of from 100 hPa or higher to 400 hPa or lower.

A TiC layer can be formed by chemical vapor deposition with a raw material gas composition of $TiCl_4$: from 1.5 mol % or more to 3.5 mol % or less, $CH_4$: from 3.0 mol % or more to 7.0 mol % or less, and $H_2$: the balance, a temperature of from 950° C. or higher to 1,050° C. or lower, and a pressure of from 65 hPa or higher to 85 hPa or lower.

A TiCN layer can be formed by chemical vapor deposition with a raw material gas composition of $TiCl_4$: from 8.0 mol % or more to 18.0 mol % or less, $CH_3CN$: from 0.5 mol % or more to 3.0 mol % or less, and $H_2$: the balance, a temperature of from 840° C. or higher to 890° C. or lower, and a pressure of from 60 hPa or higher to 80 hPa or lower. At this time, $I_{311}/I_{220}$ can be adjusted so as to fall within a range of from 1.5 or more to 20.0 or less by controlling the molar ratio of $TiCl_4$ to $CH_3CN$, i.e., $TiCl_4/CH_3CN$, so as to be from 4.0 or more to 8.0 or less.

A TiCNO layer can be formed by chemical vapor deposition with a raw material gas composition of $TiCl_4$: from 3.0 mol % or more to 5.0 mol % or less, CO: from 0.4 mol % or more to 1.0 mol % or less, $N_2$: from 30 mol % or more to 40 mol % or less, and $H_2$: the balance, a temperature of from 975° C. or higher to 1,025° C. or lower, and a pressure of from 90 hPa or higher to 110 hPa or lower.

A TiCO layer can be formed by chemical vapor deposition with a raw material gas composition of $TiCl_4$: from 0.5 mol % or more to 1.5 mol % or less, CO: from 2.0 mol % or more to 4.0 mol % or less, and $H_2$: the balance, a temperature of from 975° C. or higher to 1,025° C. or lower, and a pressure of from 60 hPa or higher to 100 hPa or lower.

In the present embodiment, a coated cutting tool which involves the controlled orientation relationship of an α-type aluminum oxide layer can be obtained by, for example, the method set forth below.

Firstly, a lowermost layer (a TiN layer), a TiCN layer or an intermediate layer is formed on a surface of a substrate of a coated cutting tool. Then, a surface of the TiN layer, the TiCN layer or the intermediate layer is oxidized. Thereafter, two kinds of nuclei of aluminum oxide are formed thereon, and an α-type aluminum oxide layer is formed in the state in which such nuclei have been formed. Further, an outermost layer may be formed as appropriate.

The first nucleus of aluminum oxide is formed with a very small amount of CO gas being caused to flow at a low temperature. This leads to the formation of the first nucleus of aluminum oxide at a very slow rate. Further, the first nucleus of aluminum oxide is minute. The time during which the first nucleus of aluminum oxide is formed is preferably from 2 minutes or more to 5 minutes or less. Thus, the α-type aluminum oxide layer is prone to have preferential orientation of a (0,0,12) plane.

Next, the second nucleus of aluminum oxide is formed. The second nucleus of aluminum oxide is formed with a very small amount of $C_3H_6$ gas being caused to flow at a high temperature. Further, the second nucleus of aluminum oxide can be formed within the first nucleus of aluminum oxide or on the surface thereof. The time during which the second nucleus of aluminum oxide is formed is preferably from 2 minutes or more to 5 minutes or less. The combination of this step and an oxidation step allows the α-type aluminum oxide layer to be prone to have preferential orientation of a (1,2,11) plane.

In order to obtain an α-type aluminum oxide layer which satisfies a TC (0,0,12) and a TC (1,2,11), after the formation of the two kinds of nuclei of aluminum oxide, the α-type aluminum oxide layer may be formed under the condition that a CO gas is not caused to flow. At this time, the deposition temperature is preferably made higher than the temperature at which the first nucleus of aluminum oxide is formed.

More specifically, the oxidation of the surface of the TiN layer, the TiCN layer or the intermediate layer is performed under the conditions of a raw material gas composition of $CO_2$: from 0.1 mol % or more to 1.0 mol % or less, $C_2H_4$: from 0.05 mol % or more to 0.2 mol % or less, and $H_2$: the balance, a temperature of from 900° C. or higher to 950° C. or lower, and a pressure of from 50 hPa or higher to 70 hPa or lower. Here, oxidation is preferably performed for from 5 minutes or more to 10 minutes or less.

Thereafter, the first nucleus of α-type aluminum oxide is formed by chemical vapor deposition with a raw material gas composition of $AlCl_3$: from 1.0 mol % or more to 4.0 mol % or less, $CO_2$: from 1.0 mol % or more to 3.0 mol % or less, CO: from 0.05 mol % or more to 2.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower.

Then, the second nucleus of α-type aluminum oxide is formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $C_3H_6$: from 0.05 mol % or more to 0.2 mol % or less, and $H_2$: the balance, a temperature of from 970° C. or higher to 1,030° C. or lower, and a pressure of from 60 hPa or higher to 80 hPa or lower.

Further, the α-type aluminum oxide layer is formed by chemical vapor deposition with a raw material gas composition of $AlCl_3$: from 2.0 mol % or more to 5.0 mol % or less, 002: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 970° C. or higher to 1,030° C. or lower, and a pressure of from 60 hPa or higher to 80 hPa or lower.

As described above, the surface of the TiN layer, the TiCN layer or the intermediate layer is oxidized, and the two kinds of nuclei of aluminum oxide are then formed. Thereafter, an α-type aluminum oxide layer is formed with normal conditions, thereby making it possible to obtain an α-type aluminum oxide layer involving a TC (0,0,12) of 4.0 or more and a TC (1,2,11) of 0.5 or more. At this time, the existence ratio of the two kinds of nuclei of aluminum oxide is adjusted, whereby the orientation relationship of the α-type aluminum oxide layer can be controlled.

After the formation of the coating layer, dry blasting, wet blasting or shot peening is performed thereon, thereby making it possible to control the residual stress value in a (1,1,6) plane of the α-type aluminum oxide layer. For instance, as to the conditions for dry shot blasting, a shot material may be shot onto a surface of the coating layer at a shot velocity of from 50 m/sec or more to 80 m/sec or less and for a shot time of from 0.5 minutes or more to 3 minutes or less so as to achieve a shot angle of from 30° or more to 70° or less. The medium in dry shot blasting is preferably a material, such as $Al_2O_3$ or $ZrO_2$, which has an average particle size of from 100 μm or more to 150 μm or less.

The thickness of each layer in the coating layer of the coated cutting tool of the present embodiment can be measured from a cross-sectional structure of the coated cutting tool, using an optical microscope, a scanning electron microscope (SEM), an FE-SEM or the like. It should be noted that the average thickness of each layer in the coated cutting tool of the present embodiment may be obtained by: measuring the thickness of each layer at three or more locations near the position 50 μm from the edge, toward the center of the rake surface of the coated cutting tool; and calculating the average value of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS) or the like.

EXAMPLES

Although the present invention will be described in further detail below, with examples, the present invention is not limited to such examples.

A cemented carbide cutting insert with a shape of JIS standard CNMA120412 and a composition of 93.0WC-6.400-0.6$Cr_3C_2$ (mass %) was prepared as a substrate. The cutting edge of such substrate was subjected to round honing by means of an SiC brush, and the surface of the substrate was then washed.

After the substrate surface was washed, a coating layer was formed by chemical vapor deposition. As to invention samples 1 to 11, firstly, the substrate was inserted into an external heating chemical vapor deposition apparatus, and a lowermost layer, which is shown in Table 1, was formed on the substrate surface so as to have the average thickness shown in Table 1. At this time, the lowermost layer was formed under the raw material gas composition, temperature and pressure conditions shown in Table 2. Then, a TiCN layer, which is shown in Table 1, was formed on the surface of the lowermost layer so as to have the average thickness shown in Table 1 under the raw material gas composition, temperature and pressure conditions shown in Table 3. Next, an intermediate layer, which is shown in Table 1, was formed on the surface of the TiCN layer so as to have the average thickness shown in Table 1 under the raw material gas composition, temperature and pressure conditions shown in Table 2. Thereafter, the surface of the intermediate layer was oxidized for the time shown in Table 4 and under the raw material gas composition, temperature and pressure conditions shown in Table 4. Then, a first nucleus of aluminum oxide was formed on the oxidized surface of the intermediate layer under the raw material gas composition, temperature and pressure conditions shown in Table 5. The time during which the first nucleus of aluminum oxide was formed was set at 4 minutes. Further, a second nucleus of aluminum oxide was formed within the first nucleus of aluminum oxide or on the surface thereof under the raw material gas composition, temperature and pressure conditions shown in Table 5. The time during which the second nucleus of aluminum oxide was formed was set at 4 minutes. Thereafter, an α-type aluminum oxide layer (hereinafter referred to as an α-type $Al_2O_3$ layer), which is shown in Table 1, was formed on the surface of the intermediate layer and the surfaces of the two kinds of nuclei of aluminum oxide so as to have the average thickness shown in Table 1 under the raw material gas composition, temperature and pressure conditions shown in Table 6. Lastly, an outermost layer, which is shown in Table 1, was formed on the surface of the α-type $Al_2O_3$ layer so as to have the average thickness shown in Table 1 under the raw material gas composition, temperature and pressure conditions shown in Table 2. As a result, the coated cutting tools of invention samples 1 to 11 were obtained.

Meanwhile, as to comparative samples 1 to 10, firstly, the substrate was inserted into an external heating chemical vapor deposition apparatus, and a lowermost layer, which is shown in Table 1, was formed on the substrate surface so as to have the average thickness shown in Table 1 under the raw material gas composition, temperature and pressure conditions shown in Table 2. Then, a TiCN layer, which is shown in Table 1, was formed on the surface of the lowermost layer so as to have the average thickness shown in Table 1 under the raw material gas composition, temperature and pressure conditions shown in Table 3. Next, an intermediate layer, which is shown in Table 1, was formed on the surface of the TiCN layer so as to have the average thickness shown in Table 1 under the raw material gas composition, temperature and pressure conditions shown in Table 2. Thereafter, the surface of the intermediate layer was oxidized for the time shown in Table 4 and under the raw material gas composition, temperature and pressure conditions shown in Table 4. Then, one or two kinds of nucleus or nuclei of aluminum oxide was/were formed on the oxidized surface of the intermediate layer under the raw material gas composition, temperature and pressure conditions shown in Table 7. Herein, the term "no step" in Table 7 indicates no step of forming the second nucleus of aluminum oxide. Further, an α-type $Al_2O_3$ layer, which is shown in Table 1, was formed on the surface of the intermediate layer and the surface or surfaces of the nucleus or nuclei of aluminum oxide so as to have the average thickness shown in Table 1 under the raw material gas composition, temperature and pressure conditions shown in Table 8. Lastly, an outermost layer, which is shown in Table 1, was formed on the surface of the α-type $Al_2O_3$ layer so as to have the average thickness shown in Table 1 under the raw material gas composition, temperature and pressure conditions shown in Table 2. As a result, the coated cutting tools of comparative samples 1 to 10 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the average value of the resulting measurements. Using an EDS, the composition of each layer of the obtained sample was measured from the cross-sectional surface near the position at most 50 μm from the edge of the coated cutting tool, toward the center of the rake surface thereof.

TABLE 1

| | Coating layer | | | | | |
|---|---|---|---|---|---|---|
| | Lowermost layer | | TiCN layer | | Intermediate layer | |
| Sample No. | Composition | Average thickness (μm) | Composition | Average thickness (μm) | Composition | Average thickness (μm) |
| Invention sample 1 | TiN | 0.1 | TiCN | 3.2 | TiCNO | 0.4 |
| Invention sample 2 | TiN | 0.1 | TiCN | 6.0 | TiCNO | 0.4 |
| Invention sample 3 | TiN | 0.3 | TiCN | 10.0 | TiCNO | 0.1 |
| Invention sample 4 | TiN | 0.3 | TiCN | 19.8 | TiCNO | 0.2 |
| Invention sample 5 | TiN | 0.5 | TiCN | 14.6 | TiCNO | 0.6 |
| Invention sample 6 | TiN | 0.5 | TiCN | 8.0 | TiCNO | 0.6 |
| Invention sample 7 | TiN | 1.0 | TiCN | 8.0 | TiCO | 0.2 |
| Invention sample 8 | TiN | 2.0 | TiCN | 8.2 | TiCNO | 0.8 |
| Invention sample 9 | TiC | 0.3 | TiCN | 8.2 | TiCNO | 0.8 |
| Invention sample 10 | TiN | 1.5 | TiCN | 6.0 | TiCNO | 1.2 |
| Invention sample 11 | TiN | 0.5 | TiCN | 3.0 | TiCO | 0.6 |

TABLE 1-continued

| | | | | | | |
|---|---|---|---|---|---|---|
| Comparative sample 1 | TiN | 0.1 | TiCN | 3.2 | TiCNO | 0.4 |
| Comparative sample 2 | TiN | 0.1 | TiCN | 3.0 | TiCNO | 0.4 |
| Comparative sample 3 | TiN | 0.3 | TiCN | 19.8 | TiCNO | 0.2 |
| Comparative sample 4 | TiC | 0.3 | TiCN | 3.2 | TiCNO | 0.1 |
| Comparative sample 5 | TiN | 0.5 | TiCN | 8.0 | TiCNO | 0.1 |
| Comparative sample 6 | TiN | 0.5 | TiCN | 14.4 | TiCNO | 0.2 |
| Comparative sample 7 | TiN | 0.3 | TiCN | 8.2 | TiCNO | 0.4 |
| Comparative sample 8 | TiN | 1.0 | TiCN | 8.0 | TiCO | 0.6 |
| Comparative sample 9 | TiN | 1.5 | TiCN | 8.2 | TiCNO | 0.6 |
| Comparative sample 10 | TiN | 1.5 | TiCN | 8.0 | TiCNO | 1.2 |

| | Coating layer | | | | |
|---|---|---|---|---|---|
| | α-type Al$_2$O$_3$ layer | | Outermost layer | | |
| Sample No. | Crystal system | Average thickness (μm) | Composition | Average thickness (μm) | Total thickness (μm) |
| Invention sample 1 | α | 8.0 | TiN | 0.2 | 11.9 |
| Invention sample 2 | α | 8.0 | TiN | 0.2 | 14.7 |
| Invention sample 3 | α | 8.2 | TiN | 0.4 | 19.0 |
| Invention sample 4 | α | 8.2 | TiN | 0.4 | 28.9 |
| Invention sample 5 | α | 5.2 | TiN | 0.4 | 21.3 |
| Invention sample 6 | α | 4.8 | TiN | 0.6 | 14.5 |
| Invention sample 7 | α | 10.4 | TiN | 0.2 | 19.8 |
| Invention sample 8 | α | 15.2 | TiN | 0.4 | 26.6 |
| Invention sample 9 | α | 2.2 | TiN | 0.2 | 11.7 |
| Invention sample 10 | α | 2.4 | TiN | 0.2 | 11.3 |
| Invention sample 11 | α | 4.2 | TiN | 0.2 | 8.5 |
| Comparative sample 1 | α | 8.0 | TiN | 0.2 | 11.9 |
| Comparative sample 2 | α | 8.2 | TiN | 0.2 | 11.9 |
| Comparative sample 3 | α | 8.2 | TiN | 0.4 | 28.9 |
| Comparative sample 4 | α | 5.0 | TiN | 0.4 | 9.0 |
| Comparative sample 5 | α | 4.8 | TiN | 0.2 | 13.6 |
| Comparative sample 6 | α | 4.8 | TiN | 0.2 | 20.1 |
| Comparative sample 7 | α | 15.0 | TiN | 0.6 | 24.5 |
| Comparative sample 8 | α | 10.2 | TiN | 0.6 | 20.4 |
| Comparative sample 9 | α | 2.4 | TiN | 0.4 | 13.1 |
| Comparative sample 10 | α | 7.8 | TiN | 0.4 | 18.9 |

TABLE 2

| Coating layer Type | Temperature (° C.) | Pressure (hPa) | Raw material composition (mol %) |
|---|---|---|---|
| TiN | 900 | 400 | $TiCl_4$: 7.5%, $N_2$: 40.0%, $H_2$: 52.5% |
| TiC | 1,000 | 75 | $TiCl_4$: 2.4%, $CH_4$: 4.6%, $H_2$: 93.0% |
| TiCNO | 1,000 | 100 | $TiCl_4$: 3.5%, CO: 0.7%, $N_2$: 35.5%, $H_2$: 60.3% |
| TiCO | 1,000 | 80 | $TiCl_4$: 1.3%, CO: 2.7%, $H_2$: 96.0% |

TABLE 3

| Sample No. | Temperature (° C.) | Pressure (hPa) | Raw material composition (mol %) |
|---|---|---|---|
| Invention sample 1 | 890 | 60 | $TiCl_4$: 12.0%, $CH_3CN$: 1.5%, $H_2$: 86.5% |
| Invention sample 2 | 840 | 70 | $TiCl_4$: 10.0%, $CH_3CN$: 1.5%, $H_2$: 88.5% |
| Invention sample 3 | 870 | 70 | $TiCl_4$: 10.0%, $CH_3CN$: 2.0%, $H_2$: 88.0% |
| Invention sample 4 | 840 | 80 | $TiCl_4$: 8.0%, $CH_3CN$: 3.0%, $H_2$: 89.0% |
| Invention sample 5 | 870 | 70 | $TiCl_4$: 10.0%, $CH_3CN$: 2.0%, $H_2$: 88.0% |
| Invention sample 6 | 870 | 80 | $TiCl_4$: 16.0%, $CH_3CN$: 1.0%, $H_2$: 83.0% |
| Invention sample 7 | 870 | 70 | $TiCl_4$: 14.0%, $CH_3CN$: 1.5%, $H_2$: 84.5% |
| Invention sample 8 | 870 | 70 | $TiCl_4$: 16.0%, $CH_3CN$: 1.0%, $H_2$: 83.0% |
| Invention sample 9 | 890 | 70 | $TiCl_4$: 10.0%, $CH_3CN$: 1.5%, $H_2$: 88.5% |
| Invention sample 10 | 870 | 70 | $TiCl_4$: 8.0%, $CH_3CN$: 2.0%, $H_2$: 90.0% |
| Invention sample 11 | 890 | 70 | $TiCl_4$: 8.0%, $CH_3CN$: 3.0%, $H_2$: 89.0% |
| Comparative sample 1 | 870 | 70 | $TiCl_4$: 10.0%, $CH_3CN$: 2.0%, $H_2$: 88.0% |
| Comparative sample 2 | 840 | 70 | $TiCl_4$: 10.0%, $CH_3CN$: 1.5%, $H_2$: 88.5% |
| Comparative sample 3 | 890 | 70 | $TiCl_4$: 8.0%, $CH_3CN$: 3.0%, $H_2$: 89.0% |
| Comparative sample 4 | 870 | 70 | $TiCl_4$: 14.0%, $CH_3CN$: 1.5%, $H_2$: 84.5% |
| Comparative sample 5 | 870 | 60 | $TiCl_4$: 8.0%, $CH_3CN$: 2.0%, $H_2$: 90.0% |
| Comparative sample 6 | 870 | 80 | $TiCl_4$: 10.0%, $CH_3CN$: 1.5%, $H_2$: 88.5% |
| Comparative sample 7 | 870 | 70 | $TiCl_4$: 14.0%, $CH_3CN$: 1.5%, $H_2$: 84.5% |
| Comparative sample 8 | 870 | 70 | $TiCl_4$: 10.0%, $CH_3CN$: 2.0%, $H_2$: 88.0% |
| Comparative sample 9 | 870 | 70 | $TiCl_4$: 8.0%, $CH_3CN$: 3.0%, $H_2$: 89.0% |
| Comparative sample 10 | 870 | 70 | $TiCl_4$: 8.0%, $CH_3CN$: 2.5%, $H_2$: 89.5% |

TABLE 4

| Sample No. | Temperature (° C.) | Pressure (hPa) | Raw material composition (mol %) | Time (min) |
|---|---|---|---|---|
| Invention sample 1 | 920 | 70 | $CO_2$: 0.3%, $C_2H_4$: 0.1%, $H_2$: 99.6% | 5 |
| Invention sample 2 | 920 | 60 | $CO_2$: 0.7%, $C_2H_4$: 0.1%, $H_2$: 99.2% | 7 |
| Invention sample 3 | 920 | 70 | $CO_2$: 0.1%, $C_2H_4$: 0.1%, $H_2$: 99.8% | 7 |
| Invention sample 4 | 950 | 60 | $CO_2$: 0.3%, $C_2H_4$: 0.05%, $H_2$: 99.65% | 10 |
| Invention sample 5 | 920 | 50 | $CO_2$: 1.0%, $C_2H_4$: 0.1%, $H_2$: 98.9% | 7 |
| Invention sample 6 | 900 | 60 | $CO_2$: 0.5%, $C_2H_4$: 0.2%, $H_2$: 99.3% | 5 |
| Invention sample 7 | 920 | 50 | $CO_2$: 0.3%, $C_2H_4$: 0.15%, $H_2$: 99.55% | 10 |
| Invention sample 8 | 970 | 60 | $CO_2$: 0.3%, $C_2H_4$: 0.2%, $H_2$: 99.5% | 7 |
| Invention sample 9 | 920 | 60 | $CO_2$: 0.5%, $C_2H_4$: 0.1%, $H_2$: 99.4% | 10 |
| Invention sample 10 | 920 | 70 | $CO_2$: 0.7%, $C_2H_4$: 0.1%, $H_2$: 99.2% | 7 |
| Invention sample 11 | 950 | 50 | $CO_2$: 0.7%, $C_2H_4$: 0.05%, $H_2$: 99.25% | 10 |
| Comparative sample 1 | 920 | 50 | $CO_2$: 0.7%, $H_2$: 99.3% | 5 |
| Comparative sample 2 | 920 | 60 | $CO_2$: 0.7%, $C_2H_4$: 0.1%, $H_2$: 99.2% | 7 |
| Comparative sample 3 | 920 | 70 | $CO_2$: 0.3%, $H_2$: 99.7% | 5 |
| Comparative sample 4 | 920 | 60 | $CO_2$: 0.1%, $H_2$: 99.9% | 10 |
| Comparative sample 5 | 920 | 70 | $CO_2$: 1.0%, $H_2$: 99.0% | 10 |
| Comparative sample 6 | 920 | 60 | $CO_2$: 0.7%, $H_2$: 99.3% | 5 |
| Comparative sample 7 | 900 | 60 | $CO_2$: 0.3%, $H_2$: 99.7% | 10 |
| Comparative sample 8 | 920 | 60 | $CO_2$: 0.3%, $C_2H_4$: 0.1%, $H_2$: 99.6% | 2 |
| Comparative sample 9 | 920 | 50 | $CO_2$: 0.7%, $H_2$: 99.3% | 5 |
| Comparative sample 10 | 950 | 70 | $CO_2$: 0.3%, $H_2$: 99.7% | 10 |

TABLE 5

| Sample No. | First nucleus formation conditions | | | Second nucleus formation conditions | | |
|---|---|---|---|---|---|---|
| | Temperature (° C.) | Pressure (hPa) | Raw material composition (mol %) | Temperature (° C.) | Pressure (hPa) | Raw material composition (mol %) |
| Invention sample 1 | 900 | 70 | $AlCl_3$: 2.5%, $CO_2$: 2.5%, CO: 1.0%, HCl: 2.5%, $H_2$: 91.5% | 990 | 70 | $AlCl_3$: 3.0%, $CO_2$: 3.0%, HCl: 2.5%, $C_3H_6$: 0.1%, $H_2$: 91.4% |
| Invention sample 2 | 900 | 70 | $AlCl_3$: 4.0%, $CO_2$: 1.6%, CO: 1.0%, HCl: 2.7%, $H_2$: 90.7% | 990 | 70 | $AlCl_3$: 3.5%, $CO_2$: 3.5%, HCl: 2.2%, $C_3H_6$: 0.1%, $H_2$: 90.7% |
| Invention sample 3 | 900 | 70 | $AlCl_3$: 1.5%, $CO_2$: 2.0%, CO: 1.5%, HCl: 2.0%, $H_2$: 93.0% | 990 | 70 | $AlCl_3$: 2.5%, $CO_2$: 3.5%, HCl: 2.5%, $C_3H_6$: 0.1%, $H_2$: 91.4% |
| Invention sample 4 | 930 | 70 | $AlCl_3$: 3.5%, $CO_2$: 2.0%, CO: 1.5%, HCl: 3.0%, $H_2$: 90.0% | 1,030 | 70 | $AlCl_3$: 2.0%, $CO_2$: 3.5%, HCl: 2.5%, $C_3H_6$: 0.05%, $H_2$: 91.95% |
| Invention sample 5 | 900 | 60 | $AlCl_3$: 2.0%, $CO_2$: 2.0%, CO: 2.0%, HCl: 2.3%, $H_2$: 91.7% | 990 | 60 | $AlCl_3$: 3.5%, $CO_2$: 4.0%, HCl: 2.5%, $C_3H_6$: 0.1%, $H_2$: 89.9% |

TABLE 5-continued

| | First nucleus formation conditions | | | Second nucleus formation conditions | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Invention sample 6 | 880 | 70 | $AlCl_3$: 1.0%, $CO_2$: 3.0%, CO: 0.5%, HCl: 2.5%, $H_2$: 93.0% | 970 | 70 | $AlCl_3$: 4.5%, $CO_2$: 2.5%, HCl: 2.5%, $C_3H_6$: 0.2%, $H_2$: 90.3% |
| Invention sample 7 | 900 | 80 | $AlCl_3$: 2.5%, $CO_2$: 2.5%, CO: 1.0%, HCl: 2.5%, $H_2$: 91.5% | 990 | 80 | $AlCl_3$: 5.0%, $CO_2$: 2.5%, HCl: 2.5%, $C_3H_6$: 0.15%, $H_2$: 89.85% |
| Invention sample 8 | 880 | 60 | $AlCl_3$: 3.0%, $CO_2$: 2.0%, CO: 0.1%, HCl: 2.5%, $H_2$: 92.4% | 970 | 60 | $AlCl_3$: 2.0%, $CO_2$: 3.0%, HCl: 2.5%, $C_3H_6$: 0.2%, $H_2$: 92.3% |
| Invention sample 9 | 900 | 60 | $AlCl_3$: 2.5%, $CO_2$: 1.5%, CO: 1.5%, HCl: 2.3%, $H_2$: 92.2% | 990 | 60 | $AlCl_3$: 3.0%, $CO_2$: 3.0%, HCl: 2.5%, $C_3H_6$: 0.1%, $H_2$: 91.4% |
| Invention sample 10 | 900 | 70 | $AlCl_3$: 2.5%, $CO_2$: 1.5%, CO: 1.5%, HCl: 2.3%, $H_2$: 92.2% | 990 | 70 | $AlCl_3$: 3.0%, $CO_2$: 3.0%, HCl: 2.5%, $C_3H_6$: 0.1%, $H_2$: 91.4% |
| Invention sample 11 | 930 | 80 | $AlCl_3$: 2.0%, $CO_2$: 2.0%, CO: 2.0%, HCl: 2.3%, $H_2$: 91.7% | 1,030 | 80 | $AlCl_3$: 3.0%, $CO_2$: 3.5%, HCl: 2.0%, $C_3H_6$: 0.05%, $H_2$: 91.45% |

TABLE 6

| | Deposition conditions | | |
|---|---|---|---|
| Sample No. | Temperature (° C.) | Pressure (hPa) | Raw material composition (mol %) |
| Invention sample 1 | 1,010 | 70 | $AlCl_3$: 4.0%, $CO_2$: 2.5%, HCl: 2.7%, $H_2S$: 0.2%, $H_2$: 90.6% |
| Invention sample 2 | 990 | 70 | $AlCl_3$: 3.0%, $CO_2$: 3.0%, HCl: 3.0%, $H_2S$: 0.2%, $H_2$: 90.8% |
| Invention sample 3 | 970 | 70 | $AlCl_3$: 2.5%, $CO_2$: 2.5%, HCl: 2.0%, $H_2S$: 0.2%, $H_2$: 92.8% |
| Invention sample 4 | 1,010 | 70 | $AlCl_3$: 5.0%, $CO_2$: 4.0%, HCl: 2.5%, $H_2S$: 0.15%, $H_2$: 88.35% |
| Invention sample 5 | 990 | 60 | $AlCl_3$: 2.5%, $CO_2$: 2.5%, HCl: 2.0%, $H_2S$: 0.2%, $H_2$: 92.8% |
| Invention sample 6 | 970 | 70 | $AlCl_3$: 2.0%, $CO_2$: 3.5%, HCl: 2.5%, $H_2S$: 0.25%, $H_2$: 91.75% |
| Invention sample 7 | 990 | 80 | $AlCl_3$: 4.0%, $CO_2$: 2.5%, HCl: 2.7%, $H_2S$: 0.2%, $H_2$: 90.6% |
| Invention sample 8 | 990 | 60 | $AlCl_3$: 4.0%, $CO_2$: 2.5%, HCl: 2.7%, $H_2S$: 0.2%, $H_2$: 90.6% |
| Invention sample 9 | 1,010 | 60 | $AlCl_3$: 3.0%, $CO_2$: 3.0%, HCl: 3.0%, $H_2S$: 0.2%, $H_2$: 90.8% |
| Invention sample 10 | 1,030 | 70 | $AlCl_3$: 3.0%, $CO_2$: 3.0%, HCl: 3.0%, $H_2S$: 0.2%, $H_2$: 90.8% |
| Invention sample 11 | 990 | 80 | $AlCl_3$: 4.0%, $CO_2$: 4.0%, HCl: 2.5%, $H_2S$: 0.15%, $H_2$: 89.35% |

TABLE 7

| | Nucleus formation conditions (1) | | | Nucleus formation conditions (2) | | |
|---|---|---|---|---|---|---|
| Sample No. | Temperature (° C.) | Pressure (hPa) | Raw material composition (mol %) | Temperature (° C.) | Pressure (hPa) | Raw material composition (mol %) |
| Comparative sample 1 | 900 | 60 | $AlCl_3$: 2.5%, $CO_2$: 2.5%, HCl: 2.5%, $H_2$: 92.5% | | No step | |
| Comparative sample 2 | 900 | 80 | $AlCl_3$: 2.5%, $CO_2$: 1.5%, HCl: 2.3%, $H_2$: 93.7% | 990 | 70 | $AlCl_3$: 2.5%, $CO_2$: 3.0%, HCl: 2.5%, $C_3H_6$: 0.1%, $H_2$: 91.9% |
| Comparative sample 3 | 880 | 70 | $AlCl_3$: 1.0%, $CO_2$: 3.0%, CO: 0.5%, HCl: 2.5%, $H_2$: 93.0% | | No step | |
| Comparative sample 4 | 1,030 | 70 | $AlCl_3$: 3.5%, $CO_2$: 2.0%, HCl: 3.0%, $H_2$: 91.5% | | No step | |
| Comparative sample 5 | 900 | 70 | $AlCl_3$: 3.0%, $CO_2$: 3.5%, HCl: 2.5%, $H_2$: 91.0% | | No step | |
| Comparative sample 6 | 880 | 60 | $AlCl_3$: 3.0%, $CO_2$: 2.0%, CO: 0.1%, HCl: 2.5%, $H_2$: 92.4% | 990 | 70 | $AlCl_3$: 2.5%, $CO_2$: 2.5%, HCl: 3.0%, $H_2$: 92.0% |
| Comparative sample 7 | 900 | 70 | $AlCl_3$: 3.0%, $CO_2$: 3.5%, HCl: 2.5%, $H_2$: 91.0% | | No step | |
| Comparative sample 8 | 990 | 60 | $AlCl_3$: 2.0%, $CO_2$: 3.0%, CO: 0.05%, HCl: 2.5%, $H_2$: 92.45% | 990 | 70 | $AlCl_3$: 3.5%, $CO_2$: 2.5%, HCl: 2.0%, $C_3H_6$: 0.1%, $H_2$: 91.9% |
| Comparative sample 9 | 900 | 60 | $AlCl_3$: 4.0%, $CO_2$: 1.6%, CO: 1.0%, HCl: 2.7%, $H_2$: 90.7% | 990 | 60 | $AlCl_3$: 4.0%, $CO_2$: 3.5%, HCl: 2.0%, $H_2$: 90.5% |
| Comparative sample 10 | 900 | 60 | $AlCl_3$: 3.0%, $CO_2$: 2.0%, CO: 0.05%, HCl: 2.0%, $H_2$: 92.95% | 990 | 70 | $AlCl_3$: 3.5%, $CO_2$: 2.5%, HCl: 2.0%, $H_2$: 92.0% |

TABLE 8

| Sample No. | Deposition conditions | | |
|---|---|---|---|
| | Temperature (° C.) | Pressure (hPa) | Raw material composition (mol %) |
| Comparative sample 1 | 990 | 60 | $AlCl_3$: 3.0%, $CO_2$: 3.0%, HCl: 3.0%, $H_2S$: 0.2%, $H_2$: 90.8% |
| Comparative sample 2 | 990 | 80 | $AlCl_3$: 4.0%, $CO_2$: 2.5%, HCl: 2.7%, $H_2S$: 0.2%, $H_2$: 90.6% |
| Comparative sample 3 | 970 | 70 | $AlCl_3$: 3.0%, $CO_2$: 3.0%, HCl: 3.0%, $H_2S$: 0.2%, $H_2$: 90.8% |
| Comparative sample 4 | 1,010 | 70 | $AlCl_3$: 4.0%, $CO_2$: 4.0%, HCl: 2.5%, $H_2S$: 0.15%, $H_2$: 89.35% |
| Comparative sample 5 | 990 | 70 | $AlCl_3$: 4.0%, $CO_2$: 2.5%, HCl: 2.7%, $H_2S$: 0.2%, $H_2$: 90.6% |
| Comparative sample 6 | 990 | 60 | $AlCl_3$: 4.0%, $CO_2$: 2.5%, HCl: 2.7%, $H_2S$: 0.2%, $H_2$: 90.6% |
| Comparative sample 7 | 1,010 | 70 | $AlCl_3$: 4.0%, $CO_2$: 2.5%, HCl: 2.7%, $H_2S$: 0.2%, $H_2$: 90.6% |
| Comparative sample 8 | 1,030 | 60 | $AlCl_3$: 2.5%, $CO_2$: 2.5%, HCl: 2.0%, $H_2S$: 0.2%, $H_2$: 92.8% |
| Comparative sample 9 | 990 | 60 | $AlCl_3$: 2.5%, $CO_2$: 2.5%, HCl: 2.0%, $H_2S$: 0.2%, $H_2$: 92.8% |
| Comparative sample 10 | 1,010 | 60 | $AlCl_3$: 5.0%, $CO_2$: 4.0%, HCl: 2.5%, $H_2S$: 0.15%, $H_2$: 88.35% |

As to invention samples 1 to 11 and comparative samples 1 to 10, after the formation of the coating layer on the surface of the substrate, dry shot blasting was performed under the shot conditions shown in Table 9, using the shot material shown in Table 9.

TABLE 9

| | Shot material | | Shot conditions | | |
|---|---|---|---|---|---|
| Sample No. | Material | Average particle size (μm) | Shot angle (°) | Shot velocity (m/sec) | Shot time (min) |
| Invention sample 1 | $Al_2O_3$ | 130 | 65 | 60 | 2.5 |
| Invention sample 2 | $Al_2O_3$ | 130 | 65 | 60 | 2.5 |
| Invention sample 3 | $ZrO_2$ | 140 | 65 | 70 | 3.0 |
| Invention sample 4 | $ZrO_2$ | 120 | 65 | 70 | 2.0 |
| Invention sample 5 | $ZrO_2$ | 120 | 65 | 70 | 2.0 |
| Invention sample 6 | $Al_2O_3$ | 120 | 55 | 65 | 1.0 |
| Invention sample 7 | $Al_2O_3$ | 120 | 55 | 65 | 1.0 |
| Invention sample 8 | $Al_2O_3$ | 100 | 45 | 50 | 1.0 |
| Invention sample 9 | $Al_2O_3$ | 100 | 45 | 50 | 1.0 |
| Invention sample 10 | $Al_2O_3$ | 150 | 70 | 80 | 3.0 |
| Invention sample 11 | $Al_2O_3$ | 130 | 45 | 55 | 0.5 |
| Comparative sample 1 | $Al_2O_3$ | 130 | 60 | 60 | 2.5 |
| Comparative sample 2 | $Al_2O_3$ | 130 | 60 | 60 | 2.5 |
| Comparative sample 3 | $ZrO_2$ | 140 | 65 | 70 | 3.0 |
| Comparative sample 4 | $ZrO_2$ | 120 | 65 | 70 | 2.0 |
| Comparative sample 5 | $ZrO_2$ | 120 | 65 | 70 | 2.0 |
| Comparative sample 6 | $Al_2O_3$ | 120 | 55 | 70 | 1.0 |
| Comparative sample 7 | $Al_2O_3$ | 120 | 55 | 70 | 1.0 |
| Comparative sample 8 | $Al_2O_3$ | 100 | 45 | 50 | 1.0 |
| Comparative sample 9 | $Al_2O_3$ | 100 | 45 | 50 | 1.0 |
| Comparative sample 10 | $Al_2O_3$ | 130 | 45 | 55 | 0.5 |

As to the obtained samples, an X-ray diffraction measurement by means of a 2θ/θ focusing optical system with Cu-Kα radiation was performed under the following conditions: an output: 50 kV, 250 mA; an incident-side solar slit: 5°; a divergence longitudinal slit: ⅔°; a divergence longitudinal limit slit: 5 mm; a scattering slit: ⅔°; a light-receiving side solar slit: 5°; a light-receiving slit: 0.3 mm; a BENT monochromater; a light-receiving monochrome slit: 0.8 mm; a sampling width: 0.01°; a scan speed: 4°/min; and a 2θ measurement range: 20°-155°. As to the apparatus, an X-ray diffractometer "RINT TTR III" manufactured by Rigaku Corporation was used. The peak intensity of each plane index of each of the α-type $Al_2O_3$ layer and the TiCN layer was obtained from an X-ray diffraction pattern. A texture coefficient TC (0,0,12) of the α-type $Al_2O_3$ layer and a texture coefficient TC (1,2,11) thereof and an intensity ratio $I_{311}/I_{220}$ of the TiCN layer were obtained from the resulting peak intensity of each plane index. The results are shown in Table 10.

TABLE 10

| | α-type $Al_2O_3$ layer | | TiCN layer |
|---|---|---|---|
| Sample No. | TC (0, 0, 12) | TC (1, 2, 11) | $I_{311}/I_{220}$ |
| Invention sample 1 | 6.1 | 1.0 | 8.2 |
| Invention sample 2 | 7.2 | 0.8 | 9.4 |
| Invention sample 3 | 7.3 | 0.9 | 5.4 |
| Invention sample 4 | 7.7 | 0.5 | 1.6 |
| Invention sample 5 | 7.0 | 0.8 | 6.2 |
| Invention sample 6 | 4.8 | 2.5 | 18.0 |
| Invention sample 7 | 5.9 | 1.6 | 11.5 |
| Invention sample 8 | 4.2 | 2.9 | 19.4 |
| Invention sample 9 | 7.0 | 1.1 | 7.8 |
| Invention sample 10 | 7.2 | 0.9 | 4.2 |
| Invention sample 11 | 8.1 | 0.6 | 1.0 |
| Comparative sample 1 | 0.5 | 0.2 | 7.0 |
| Comparative sample 2 | 0.5 | 1.0 | 8.6 |
| Comparative sample 3 | 1.0 | 0.1 | 1.1 |
| Comparative sample 4 | 0.3 | 0.4 | 10.2 |
| Comparative sample 5 | 0.6 | 0.1 | 4.5 |
| Comparative sample 6 | 4.0 | 0.1 | 8.3 |
| Comparative sample 7 | 0.6 | 0.3 | 11.6 |
| Comparative sample 8 | 1.3 | 0.9 | 7.0 |
| Comparative sample 9 | 1.4 | 0.2 | 1.4 |
| Comparative sample 10 | 0.8 | 0.1 | 2.4 |

The residual stress of the α-type $Al_2O_3$ layer of each of the obtained samples was measured by a $\sin^2\varphi$ method using an X-ray stress measuring apparatus. The measurement results are shown in Table 11.

TABLE 11

| Sample No. | α-type Al$_2$O$_3$ layer Residual stress value measured with the selection of a (1, 1, 6) plane (MPa) |
|---|---|
| Invention sample 1 | −274 |
| Invention sample 2 | −270 |
| Invention sample 3 | −288 |
| Invention sample 4 | −172 |
| Invention sample 5 | −176 |
| Invention sample 6 | 140 |
| Invention sample 7 | 135 |
| Invention sample 8 | 290 |
| Invention sample 9 | 288 |
| Invention sample 10 | −406 |
| Invention sample 11 | 44 |
| Comparative sample 1 | −266 |
| Comparative sample 2 | −264 |
| Comparative sample 3 | −284 |
| Comparative sample 4 | −166 |
| Comparative sample 5 | −170 |
| Comparative sample 6 | 152 |
| Comparative sample 7 | 146 |
| Comparative sample 8 | 288 |
| Comparative sample 9 | 296 |
| Comparative sample 10 | 40 |

The average particle size of the α-type Al$_2$O$_3$ layer of each of the obtained samples was measured by EBSD. The results are shown in Table 12.

TABLE 12

| Sample No. | α-type Al$_2$O$_3$ layer Average particle size (μm) |
|---|---|
| Invention sample 1 | 1.6 |
| Invention sample 2 | 1.0 |
| Invention sample 3 | 0.2 |
| Invention sample 4 | 1.8 |
| Invention sample 5 | 1.1 |
| Invention sample 6 | 0.5 |
| Invention sample 7 | 1.2 |
| Invention sample 8 | 0.9 |
| Invention sample 9 | 1.7 |
| Invention sample 10 | 2.9 |
| Invention sample 11 | 1.0 |
| Comparative sample 1 | 0.9 |
| Comparative sample 2 | 1.1 |
| Comparative sample 3 | 0.5 |
| Comparative sample 4 | 1.7 |
| Comparative sample 5 | 1.0 |
| Comparative sample 6 | 1.2 |
| Comparative sample 7 | 1.9 |
| Comparative sample 8 | 2.8 |
| Comparative sample 9 | 1.0 |
| Comparative sample 10 | 1.6 |

Cutting tests 1 and 2 were conducted using the obtained samples. Cutting test 1 is a test for evaluating wear resistance, and cutting test 2 is a test for evaluating fracture resistance. The results of the respective cutting tests are shown in Table 13.

[Cutting Test 1]
Workpiece material: S50C round bar
Cutting speed: 310 m/min
Feed: 0.30 mm/rev
Depth of cut: 1.8 mm
Coolant: Used
Evaluation items: A time when a sample was fractured, or a when a sample had a maximum flank wear width of 0.2 mm, was defined as the end of the tool life, and the machining time to reach the end of the tool life was measured.

[Cutting Test 2]
Workpiece material: S50C round bar with two equidistant grooves extending in the length direction
Cutting speed: 260 m/min
Feed: 0.35 mm/rev
Depth of cut: 1.5 mm
Coolant: Used
Evaluation items: A time when a sample was fractured was defined as the end of the tool life, and the number of shocks the sample had received until the end of the tool life was measured. The number of times the sample and the workpiece material were brought into contact with each other was defined as the number of shocks, and the test was ended when the number of contacts reached 20,000 at a maximum. As to each sample, five inserts were prepared and the number of shocks was measured for each of such inserts, and the average value was obtained from the measurements of the number of shocks so as to serve as the tool life.

As to the machining time to reach the end of the tool life in the wear resistance test, evaluations were made with grade "A" for 30 minutes or more, grade "B" for 20 minutes or more and less than 30 minutes, and grade "C" for less than 20 minutes. Further, as to the number of shocks until the end of the tool life in the fracture resistance test, evaluations were made with grade "A" for 15,000 or more, grade "B" for 12,000 or more and less than 15,000, and grade "C" for less than 12,000. In such evaluations, "A" refers to excellent, "B" refers to good and "C" refers to inferior, meaning that a sample involving a larger number of grade "A"s or "B"s has more excellent cutting performance. The overall evaluation results obtained are shown in Table 13.

TABLE 13

| | Wear resistance test | | | Fracture resistance test | |
|---|---|---|---|---|---|
| Sample No. | Tool life (min) | Grade | Damage form | Tool life (shocks) | Grade |
| Invention sample 1 | 30 | A | Normal wear | 17,500 | A |
| Invention sample 2 | 34 | A | Normal wear | 18,400 | A |
| Invention sample 3 | 39 | A | Normal wear | 20,000 | A |
| Invention sample 4 | 46 | A | Normal wear | 16,100 | A |
| Invention sample 5 | 42 | A | Normal wear | 17,000 | A |
| Invention sample 6 | 31 | A | Normal wear | 15,300 | A |
| Invention sample 7 | 38 | A | Normal wear | 12,600 | B |
| Invention sample 8 | 43 | A | Normal wear | 12,200 | B |
| Invention sample 9 | 32 | A | Normal wear | 13,800 | B |
| Invention sample 10 | 31 | A | Normal wear | 13,000 | B |
| Invention sample 11 | 30 | A | Normal wear | 13,100 | B |
| Comparative sample 1 | 19 | C | Normal wear | 12,300 | B |
| Comparative sample 2 | 19 | C | Normal wear | 14,400 | B |
| Comparative sample 3 | 37 | A | Fracturing | 10,500 | C |
| Comparative sample 4 | 14 | C | Normal wear | 11,900 | C |
| Comparative sample 5 | 22 | B | Normal wear | 9,900 | C |
| Comparative sample 6 | 33 | A | Fracturing | 8,600 | C |

TABLE 13-continued

| | Wear resistance test | | Fracture resistance test | |
| Sample No. | Tool life (min) | Grade | Damage form | Tool life (shocks) | Grade |
| --- | --- | --- | --- | --- | --- |
| Comparative sample 7 | 33 | A | Normal wear | 8,400 | C |
| Comparative sample 8 | 28 | B | Normal wear | 7,500 | C |
| Comparative sample 9 | 22 | B | Fracturing | 5,500 | C |
| Comparative sample 10 | 28 | B | Normal wear | 10,200 | C |

The results of Table 13 show that, as to the evaluations of the invention samples, each invention sample had grade "A" or "B" in both the wear resistance test and the fracture resistance test. Meanwhile, as to the evaluations of the comparative samples, each comparative sample had grade "C" in either the wear resistance test or the fracture resistance test. In particular, each invention sample had grade "A" or "B" in the fracture resistance test, and each comparative sample had grade "B" or "C" in such test. Accordingly, it is apparent that the fracture resistance of each invention sample is equal or superior to that of each comparative sample.

It is apparent from the above results that each invention sample has excellent wear resistance and fracture resistance and accordingly has a long tool life.

The present application is based on the Japanese patent application filed on Oct. 25, 2016 (JP Appl. 2016-208559), the content of which is incorporated herein by reference.

INDUSTRIAL APPLICABILITY

The coated cutting tool according to the present invention has improved and excellent fracture resistance without a reduction in wear resistance, whereby the tool life can be extended more than that involved in the prior art, and the coated cutting tool therefore has high industrial applicability.

What is claimed is:

1. A coated cutting tool comprising a substrate and a coating layer formed on a surface of the substrate, wherein:
   the coating layer comprises at least one α-type aluminum oxide layer; and
   in the α-type aluminum oxide layer, a texture coefficient TC (0,0,12) of a (0,0,12) plane represented by formula (1) below is from 4.0 or more to 8.4 or less, and a texture coefficient TC (1,2,11) of a (1,2,11) plane represented by formula (2) below is from 0.5 or more to 3.0 or less;

$$TC(0, 0, 12) = \frac{I(0, 0, 12)}{I_0(0, 0, 12)} \left\{ \frac{1}{9} \sum \frac{I(h, k, l)}{I_0(h, k, l)} \right\}^{-1} \quad (1)$$

$$TC(1, 2, 11) = \frac{I(1, 2, 11)}{I_0(1, 2, 11)} \left\{ \frac{1}{9} \sum \frac{I(h, k, l)}{I_0(h, k, l)} \right\}^{-1} \quad (2)$$

(In formulae (1) and (2), I (h,k,l) denotes a peak intensity for an (h,k,l) plane in X-ray diffraction of the α-type aluminum oxide layer, $I_0$ (h,k,l) denotes a standard diffraction intensity for an (h,k,l) plane which is indicated on JCPDS Card Number 10-0173 for α-type aluminum oxide, and (h,k,l) refers to the nine crystal planes of (0,1,2), (1,0,4), (1,1,0), (1,1,3), (1,1,6), (2,1,4), (3,0,0), (0,0,12) and (1,2,11).

2. The coated cutting tool according to claim 1, wherein, in the α-type aluminum oxide layer, the texture coefficient TC (0,0,12) is from 5.0 or more to 8.2 or less.

3. The coated cutting tool according to claim 1, wherein, in the α-type aluminum oxide layer, the texture coefficient TC (1,2,11) is from 1.0 or more to 2.5 or less.

4. The coated cutting tool according to claim 1, wherein a residual stress value in a (1,1,6) plane of the α-type aluminum oxide layer is, in at least part thereof, from −300 MPa or higher to 300 MPa or lower.

5. The coated cutting tool according to claim 1, wherein an average particle size of the α-type aluminum oxide layer is from 0.1 μm or more to 3.0 μm or less.

6. The coated cutting tool according to claim 1, wherein an average thickness of the α-type aluminum oxide layer is from 1.0 μm or more to 15.0 μm or less.

7. The coated cutting tool according to claim 1, wherein the coating layer comprises, between the substrate and the α-type aluminum oxide layer, a Ti compound layer containing a Ti compound of Ti and an element of at least one kind selected from the group consisting of C, N, O and B.

8. The coated cutting tool according to claim 7, wherein the Ti compound layer comprises at least one TiCN layer, and a ratio $I_{311}/I_{220}$ of a peak intensity $I_{311}$ for a (3,1,1) plane in X-ray diffraction of the TiCN layer to a peak intensity $I_{220}$ for a (2,2,0) plane in X-ray diffraction of the TiCN layer is from 1.5 or more to 20.0 or less.

9. The coated cutting tool according to claim 7, wherein an average thickness of the TiCN layer is from 2.0 μm or more to 20.0 μm or less.

10. The coated cutting tool according to claim 1, wherein an average thickness of the coating layer is from 3.0 μm or more to 30.0 μm or less.

11. The coated cutting tool according to claim 1, wherein the substrate is a cemented carbide, cermet, ceramic or a cubic boron nitride sintered body.

12. The coated cutting tool according to claim 2, wherein, in the α-type aluminum oxide layer, the texture coefficient TC (1,2,11) is from 1.0 or more to 2.5 or less.

13. The coated cutting tool according to claim 2, wherein an average particle size of the α-type aluminum oxide layer is from 0.1 μm or more to 3.0 μm or less.

14. The coated cutting tool according to claim 3, wherein an average particle size of the α-type aluminum oxide layer is from 0.1 μm or more to 3.0 μm or less.

15. The coated cutting tool according to claim 2, wherein an average thickness of the α-type aluminum oxide layer is from 1.0 μm or more to 15.0 μm or less.

16. The coated cutting tool according to claim 3, wherein an average thickness of the α-type aluminum oxide layer is from 1.0 μm or more to 15.0 μm or less.

17. The coated cutting tool according to claim 5, wherein an average thickness of the α-type aluminum oxide layer is from 1.0 μm or more to 15.0 μm or less.

18. The coated cutting tool according to claim 8, wherein an average thickness of the TiCN layer is from 2.0 μm or more to 20.0 μm or less.

19. The coated cutting tool according to claim 2, wherein the coating layer comprises, between the substrate and the α-type aluminum oxide layer, a Ti compound layer containing a Ti compound of Ti and an element of at least one kind selected from the group consisting of C, N, O and B.

20. The coated cutting tool according to claim 19, wherein an average thickness of the coating layer is from 3.0 μm or more to 30.0 μm or less.

* * * * *